United States Patent
Terrovitis

(10) Patent No.: US 7,091,791 B1
(45) Date of Patent: Aug. 15, 2006

(54) TRANSFORMER IMPLEMENTATION USING BONDING WIRES

(75) Inventor: Manolis Terrovitis, Berkeley, CA (US)

(73) Assignee: Atheros Communications, Inc., Santa Clara, CA (US)

( * ) Notice: Subject to any disclaimer, the term of this patent is extended or adjusted under 35 U.S.C. 154(b) by 54 days.

(21) Appl. No.: 10/898,401

(22) Filed: Jul. 23, 2004

(51) Int. Cl.
*H03F 3/04* (2006.01)
(52) U.S. Cl. .................................... 330/301
(58) Field of Classification Search ............. 330/301, 330/66; 361/748
See application file for complete search history.

(56) References Cited

U.S. PATENT DOCUMENTS

| | | | | |
|---|---|---|---|---|
| 6,593,814 | B1 * | 7/2003 | Donig | 330/298 |
| 6,639,462 | B1 * | 10/2003 | Luu | 330/51 |
| 2003/0205778 | A1 * | 11/2003 | Yeo et al. | 257/531 |
| 2004/0111881 | A1 * | 6/2004 | Yang et al. | 29/835 |
| 2004/0266059 | A1 | 12/2004 | Wight et al. | |

OTHER PUBLICATIONS

Aoki et al.: "Fully Integrated CMOS Power Amplifier Design Using The Distributed Active-Transformer Architecture", IEEE Journal of Solid-State Circuits, vol. 37, No. 3, Mar. 2002, pp. 371-383.

* cited by examiner

*Primary Examiner*—Robert Pascal
*Assistant Examiner*—Hieu Nguyen
(74) *Attorney, Agent, or Firm*—Bever, Hoffman & Harms, LLP; Jeanette S. Harms

(57) ABSTRACT

The use of the magnetic coupling between bonding wires can be advantageously used to transform a differential signal to a single-ended signal. Because bonding wires are very good conductors, this differential to single-ended signal transformation can be performed with minimal signal loss. Moreover, because bonding wires are already part of an integrated circuit package, both system cost and board resources are minimized. The magnetic coupling between bonding wires can also be used to combine the power of a plurality of amplifiers. This magnetic coupling can also be used to provide a single-ended to differential signal transformation.

16 Claims, 4 Drawing Sheets

TRANSFORMER IMPLEMENTATION USING BONDING WIRES

BACKGROUND OF THE INVENTION

1. Field of the Invention

The present invention relates to differential to single-ended signal transformation, and in particular to using the bonding wires of a packaged integrated circuit (IC) to perform this transformation.

2. Description of the Related Art

In integrated circuits (ICs), signals can be processed in differential form. One advantage of processing signals in differential form is immunity to noise, which couples as a common mode noise in differential circuits, but adds directly to the signal in single-ended form. Another advantage of processing signals in differential form is insensitivity to package parasitics. Specifically, for small signals (i.e. signals in the linear operating range) the on-chip voltage supplies (e.g. ground or VDD) behave as virtual grounds for differential circuits. Yet another advantage of processing signals in differential form is immunity to even-order distortion (i.e. any even-order distortion is cancelled when the negative differential output is subtracted from the positive differential output). These advantages of the differential circuits become particularly important when the on-chip circuits process high frequency signals, e.g radio frequency (RF) signals.

Notably, numerous discrete components that are typically used for RF signal processing on a circuit board (e.g. filters, RF switches, and antennas) are single-ended components. Therefore, an interface between a differential component and a single-ended component is required. In typical embodiments, the differential signal of the on-chip differential component is transformed into a single-ended external signal that can be provided to the single-ended, external component.

Components called baluns (derived from "balanced" (i.e. differential) and "unbalanced" (i.e. single-ended)) can be used to provide this transformation. Unfortunately, baluns, which are typically implemented off-chip (i.e. "external" baluns), undesirably increase system cost and occupy increasingly-crowded real estate on a circuit board.

In trying to address the disadvantages of external baluns, on-chip baluns have been developed. However, because of the metal conductivity of on-chip metals, the signal loss in such on-chip baluns could be on the order of 3–4 dB. This signal loss is typically unacceptable for high performance applications (e.g. in power amplifiers). Therefore, irrespective of their disadvantages, external baluns, which have a signal loss on the order of 1 dB, are generally used instead of on-chip baluns.

Therefore, a need arises for a means to provide a differential to single-ended signal transformation with minimal signal loss, system cost, and board resources.

SUMMARY OF THE INVENTION

In accordance with one aspect of the invention, the use of the magnetic coupling between bonding wires can be advantageously used to transform a differential signal to a single-ended signal. Because bonding wires are very good conductors, this differential to single-ended signal transformation can be performed with minimal signal loss. Moreover, because bonding wires are already part of the integrated circuit package, both system cost and board resources are minimized.

An exemplary transformer can include first and second pairs of bonding wires, wherein the second pair of bonding wires carry a differential current associated with the differential signal. A first bonding wire of the first pair is connected to the single-ended signal and a second bonding wire of the first pair is coupled to a reference voltage (which could be a virtual ground, ground, VSS, etc.). A third bonding wire of the second pair is magnetically coupled to the first bonding wire and a fourth bonding wire of the second pair is magnetically coupled to the second bonding wire. In contrast, the first and second bonding wires are electrically coupled.

The transformer can be implemented in an output stage of an amplifier, wherein the output stage has first and second transistors. The first transistor can be coupled between a first voltage source (e.g. virtual ground (not necessarily the same virtual ground used for the reference voltage), ground, VSS, etc.) and the third bonding wire, and controlled by a negative component of an input differential signal. The second transistor can be coupled between the first voltage source and the fourth bonding wire, and controlled by a positive component of the input differential signal. Both the third and fourth bonding wires can be coupled to a second voltage source (e.g. a virtual ground (but different than the virtual ground used for the first voltage source), VDD, etc.).

In one embodiment, the first and second bonding wires are electrically coupled using a fifth bonding wire. In another embodiment, the first and second bonding wires are electrically coupled using interconnect on an integrated circuit.

The bonding configuration for this output stage can include multiple bonding pads and pins. For example, a first bonding pad can connect the first transistor and the third bonding wire. A second bonding pad can connect the second transistor and the fourth bonding wire. A first pin can connect the third and fourth bonding wire. A second pin can connect the first bonding wire to the single-ended signal. A third pin can connect the second bonding wire to the reference voltage. A third bonding pad can connect to the first bonding wire. A fourth bonding pad can connect to the second bonding wire. The third and fourth bonding pads can be connected using a connector (e.g. another bonding wire or interconnect).

The transformer can also be implemented in an input stage of an amplifier, wherein the input stage includes negative and positive input terminals of the amplifier. In this case, the negative input terminal can be coupled to the third bonding wire and the positive input terminal can be coupled to the fourth bonding wire. A bonding configuration similar to that used for the output stage can be used for the input stage.

A method of transforming a signal is also described. This transformation can apply to a differential to a single-ended signal transformation or a single-ended to differential signal transformation. This method can include using first bonding wires of an integrated circuit package to carry a differential current associated with the differential signal. Advantageously, second bonding wires of the integrated circuit package can be magnetically coupled to the first bonding wires, whereas the second bonding wires can be electrically coupled between the single-ended signal and the reference voltage.

A method of combining power of a plurality of amplifiers to a single-ended power output is also described. This method can include using bonding wire pairs to provide the single-ended power output. Each amplifier can comprise an output stage including first and second transistors as well as first and second pairs of bonding wires. The first transistor can be connected to the first voltage source and controlled by a negative component of an input differential signal. The second transistor can also be connected to the first voltage source and controlled by a positive component of the input differential signal. The first pair of bonding wires, which are coupled to the first and second transistors, can be coupled to the second voltage source. The second pair of bonding wires can be magnetically coupled to the first pair of bonding wires. Notably, the second pairs of bonding wires are electrically coupled in series between the single-ended power output and the reference voltage.

A bonding configuration for each of these output stages can include multiple bonding pads and pins. For example, a first pair of bonding pads can receive the first pair of bonding wires. A first pin can receive the first pair of bonding wires and a connection to the second voltage source. A second pair of bonding pads can receive the second pair of bonding wires and a connector for electrically connecting the second pair of bonding wires. A pin pair can receive the second pair of bonding wires, wherein each pin of the pin pair is shared by an adjacent output stage, coupled to the single-ended power output, or coupled to the reference voltage.

DETAILED DESCRIPTION OF THE FIGURES

Figure 1:
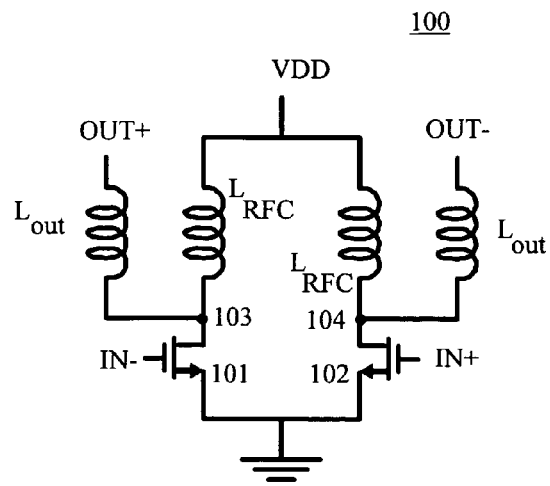
FIG. 1 illustrates a conventional power amplifier output stage.

In various types of systems, differential signals can be transformed into single-ended signals (and vice versa) using baluns. Unfortunately, these baluns, whether external or on-chip, have significant disadvantages. In accordance with one aspect of the invention, existing bonding wires used in a packaged integrated circuit (IC) can be advantageously used to provide this transformation, thereby minimizing signal loss, system cost, and board resources.

An IC includes a plurality of bonding pads that serve as terminals to the various circuits formed on the IC. Bonding wires can physically connect those terminals to an IC package. Specifically, the bonding wires are soldered to the bonding pads as well as to a lead frame, which includes the pins of the IC package. The pins of the IC package allow signals to be sent to and output from the IC.

Notably, bonding wires carrying signals at high frequencies represent finite impedances, which can be modeled with series inductance, parallel capacitance (from the bonding wires to ground and between bonding wires), and mutual inductance (between different bonding wires). Although these finite impedances are usually considered undesirable, they can be used in impedance matching networks for certain RF components, e.g. amplifiers. For example, FIG. 1 illustrates a conventional power amplifier output stage 100 including certain impedances.

In power amplifier output stage 100, transistors 101 and 102 are controlled by negative and positive components of an input differential signal, i.e. IN− and IN+, respectively. These transistors are coupled between two voltage sources. For example, the sources of transistors 101 and 102 can be connected to a first voltage source (e.g. a virtual ground, ground, VSS, etc.) whereas the drains of transistors 101 and 102 can be coupled to a second voltage supply (e.g. a virtual ground (but different than that used for the first voltage source), VDD, etc.) via inductors $L_{RFC}$. Based on the input differential signal IN− and IN+, power amplifier output stage 100 can generate an output signal, i.e. the differential signal OUT+ and OUT−.

Inductors $L_{RFC}$ (RF Chokes) provide, in an ideal case, a very high impedance at RF frequencies, thereby facilitating DC current flow to the power amplifier while preventing the RF from affecting the power supply VDD. Note that other inductors having a finite impedance providing this functionality could be used in lieu of inductors $L_{RFC}$. In contrast to inductors $L_{RFC}$, inductors $L_{out}$ typically have a much lower impedance, thereby facilitating the output of the RF energy. Therefore, in one embodiment, inductors $L_{out}$ can represent bonding wires, whereas inductors $L_{RFC}$ can represent a combination of bonding wires and external discrete inductors (for simplicity, the description herein will assume that the inductors $L_{RFC}$ represent bonding wires). Note that inductors $L_{out}$ and $L_{RFC}$ can be absorbed in impedance matching networks (not shown for clarity, but tailored to both package and board parasitics) to provide a predetermined impedance, e.g. 50 or 75 Ohms, which is used by off-chip components.

Figure 2:
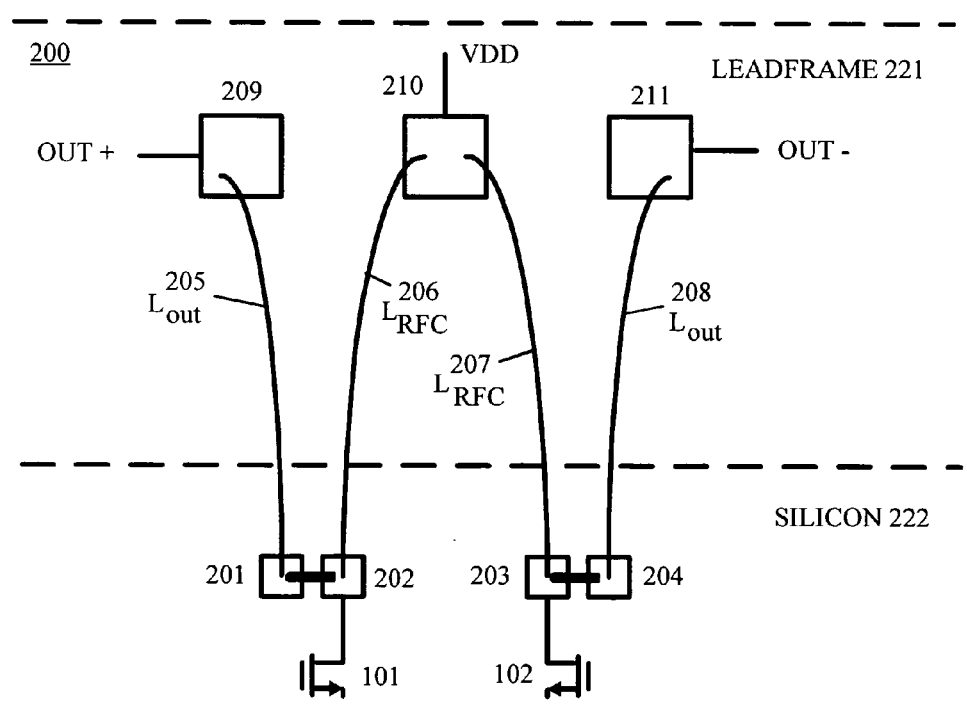
FIG. 2 illustrates an exemplary bonding diagram for the power amplifier output stage of FIG. 1.

FIG. 2 illustrates an exemplary bonding diagram 200 for power amplifier output stage 100 of FIG. 1 (transistors 101 and 102 shown in FIG. 2 for reference). In diagram 200, the drain of transistor 101 is connected to a bonding pad 202. In turn, bonding pad 202 is connected to a pin 210 via a connector 206. Similarly, the drain of transistor 102 is connected to a bonding pad 203. In turn, bonding pad 203 is connected to pin 210 via a connector 207. To form node 103 (FIG. 1), bonding pads 201 and 202 are connected, whereas bonding pads 203 and 204 are connected to form node 104. Bonding pads 201 and 204 can be connected to pins 209 and 211, respectively, via connectors 205 and 208. In this configuration, pin 210 can receive voltage source VDD whereas pins 209 and 211 can output differential signal OUT+ and OUT−.

Note that bonding pads 201, 202, 203, and 204 are formed on silicon 222 whereas pins 209, 210, and 211 are formed on leadframe 221. As indicated previously, connectors 205, 206, 207, and 208 can be implemented with bond wires. Connectors 205 and 208 form the inductances $L_{out}$ whereas connectors 206 and 207 form the inductances $L_{RFC}$.

Figure 3:
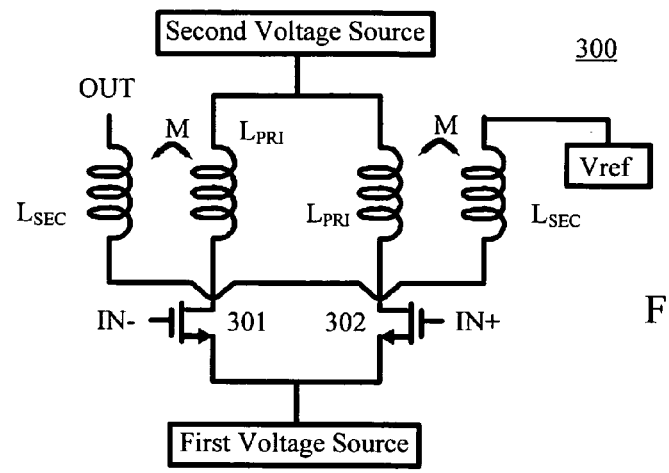
FIG. 3 illustrates an exemplary power amplifier output stage with a magnetically coupled output.

In accordance with one aspect of the invention, the magnetic coupling of the bonding wires in a power amplifier can be advantageously used for differential to single-ended signal transformation, as now explained in reference to a power amplifier output stage 300 shown in FIG. 3. In power amplifier output stage 300, the gates of transistors 301 and 302 are controlled by an input differential signal IN− and IN+, respectively. These transistors are coupled between two voltage sources. For example, the sources of transistors 101 and 102 can be connected to the first voltage source whereas the drains of transistors 301 and 302 can be coupled to the second voltage source via inductors $L_{RFC}$. Based on the input differential signal IN− and IN+, power amplifier output stage 300 can generate an output signal, i.e. the single-ended signal OUT. Notably, this single-ended signal is generated based on the magnetic coupling M generated between the inductors $L_{out}$ (which may also be denoted $L_{SEC}$ to reflect the inductance of a transformer secondary winding) and $L_{RFC}$ (which may also be denoted $L_{PRI}$ to reflect the inductance of a transformer primary winding).

Figure 4:
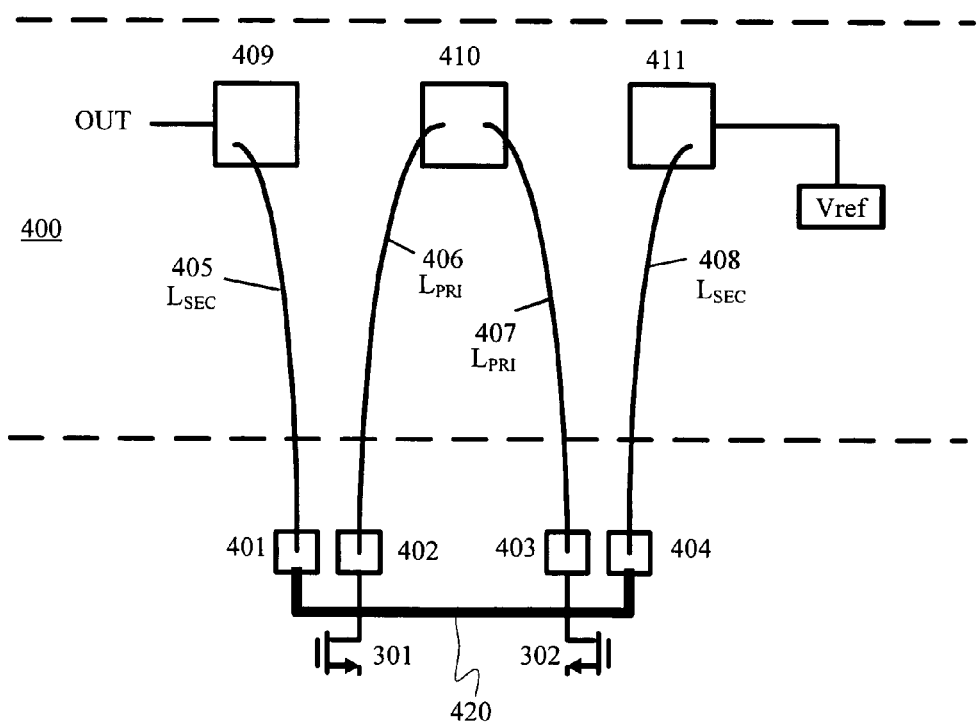
FIG. 4 illustrates an exemplary bonding diagram for the power amplifier output stage of FIG. 3.

FIG. 4 illustrates an exemplary bonding diagram 400 for power amplifier output stage 300 of FIG. 3 (transistors 301 and 302 shown in FIG. 4 for reference). In diagram 400, the drain of transistor 301 is connected to a bonding pad 402. In turn, bonding pad 402 is connected to a pin 410 via a connector 406. Similarly, the drain of transistor 302 is connected to a bonding pad 403. In turn, bonding pad 403 is connected to pin 410 via a connector 407. Bonding pads 401 and 404 can be connected to pins 409 and 411, respectively, via connectors 405 and 408. To combine the magnetically coupled signal from the outputs of the differential circuit, bonding pads 401 and 404 are electrically connected using a connector 420.

In this configuration, pin 410 can be coupled to the second voltage source, pin 411 can be coupled to a reference voltage Vref (e.g. a virtual ground (which could be the same or different virtual ground than that used for the first voltage source), ground, VSS, etc.), and pin 209 can be coupled to the single-ended signal OUT. Connectors 405 and 408 form the inductances $L_{out}$ whereas connectors 406 and 407 form the inductances $L_{RFC}$. Advantageously, inductors $L_{SEC}$ and $L_{PRI}$ can be implemented with bond wires placed in such proximity so as to create the mutual magnetic coupling M (see FIG. 3). Generally, the closer inductors $L_{SEC}$ are to inductors $L_{PRI}$, the greater the mutual magnetic coupling M. Note that inductors $L_{SEC}$ can be connected (i.e. connector 420 can be implemented) on-chip using metal interconnect or by using an intra-die bonding wire (which typically has lower parasitics than metal interconnect).

Advantageously, bonding wires are usually made from a material with excellent conductivity (e.g. gold), thereby minimizing signal loss. By comparing the conventional power amplifier output stage (FIGS. 1 and 2) with the magnetically coupled power amplifer output stage (FIGS. 3 and 4), one can note that signals circulate in the same bonding wires and therefore would logically incur similar losses. However, using the magnetically coupled power amplifier output stage eliminates the need for the external balun and its associated signal losses. The external balun is typically fabricated from materials having less conductivity than bonding wires. Therefore, implementing a balun with bonding wires results in low signal loss. Moreover, these bonding wires, which already exist, occupy no additional area on the board or on the silicon.

Note that compared to an external balun, a balun implemented with bond wires can have a relatively small amount of magnetic coupling. This small magnetic coupling (by itself) does not result in signal loss, but may benefit from a more aggressive impedance transformation. For example, a high quality (or high-Q) factor matching network can be used to generate an appropriate impedance level.

Figure 5:
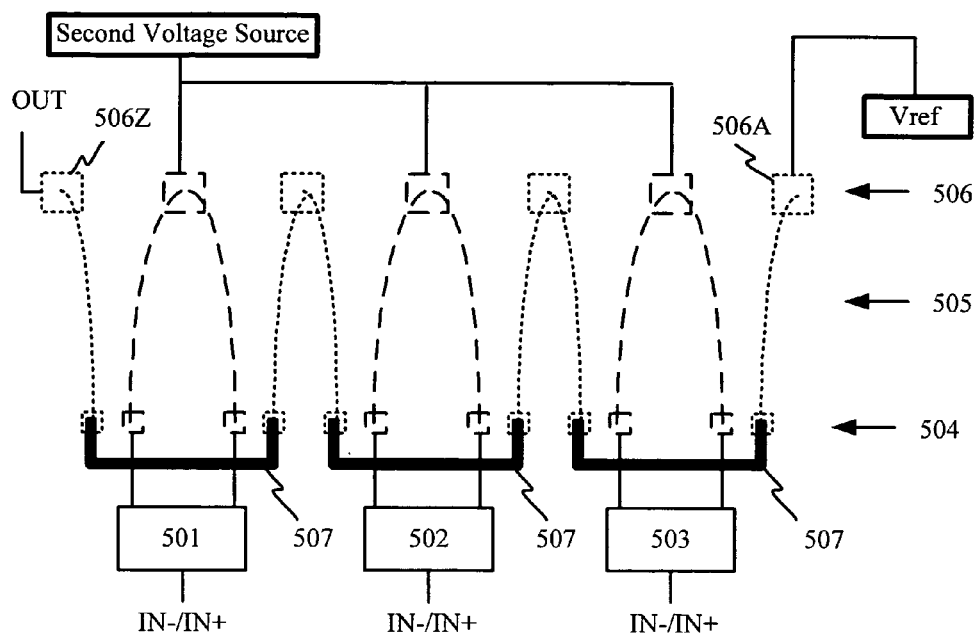
FIG. 5 illustrates an exemplary bonding diagram that uses the mutual coupling of bonding wires to combine the output power of several power amplifiers to one single-ended power output.

In accordance with another aspect of the invention discussed in reference to FIG. 5, magnetically combining the output power of multiple power amplifiers to one single-ended output can be done using the mutual coupling of bonding wires. Although FIG. 5 illustrates three power amplifiers 501, 502, and 503, other embodiments could be any number of amplifiers. Note that power amplifiers 501, 502, and 503 can each receive an input differential signal IN−/IN+, e.g. using transistors 301 and 302 (see FIGS. 3 and 4).

In accordance with one aspect of the invention, each output stage of a power amplifier includes a first pair of bonding wires associated with inductance $L_{SEC}$ (shown as dotted lines) and a second pair of bonding wires associated with inductance $L_{PRI}$ (shown as dashed lines). In accordance with one aspect of the invention, the first pair of bonding wires associated with inductance $L_{out}$ are magnetically coupled to the second pair of bonding wires associated with inductance $L_{PRI}$.

In the bonding configuration shown in FIG. 5, the bonding wires 505 associated with inductance $L_{PRI}$ are connected to the second voltage source a first set of pins 506 (shown as large squares formed using dashed lines) and are further connected to their respective power amplifiers using a first set of bonding pads 504 (shown as small squares formed using dashed lines). In contrast, the bonding wires 505 associated with inductance LSEC are connected to a second set of pins 506 (shown as large squares formed using dotted lines) and to connectors 507 using a second set of bonding pads 504 (shown as small squares formed using dotted lines).

Notably, adjacent output stages can share their second set of pins. An output stage without an adjacent output stage uses one of its second set of pins to connect to an output. In this configuration, the bonding wires 505 associated with inductance $L_{SEC}$ are connected in series. The pin on one end of the series, e.g. pin 506A, forms an output that can be coupled to the reference voltage, whereas the pin on the other end of the series, e.g. pin 506Z, can be connected to the single-ended output OUT.

Although illustrative embodiments have been described in detail herein with reference to the accompanying figures, it is to be understood that the invention is not limited to those precise embodiments. They are not intended to be exhaustive or to limit the invention to the precise forms disclosed. As such, many modifications and variations will be apparent to practitioners skilled in this art.

For example, although differential to single-ended signal transformation is discussed in reference to FIGS. 4 and 5, single-ended to differential signal transformation can also be performed using bonding wires. Moreover, although power amplifiers can benefit from this magnetic coupling, other amplifiers (e.g. low-noise amplifiers) or any circuits performing signal transformation can also use the above-described bonding wire technique.

Figure 6:
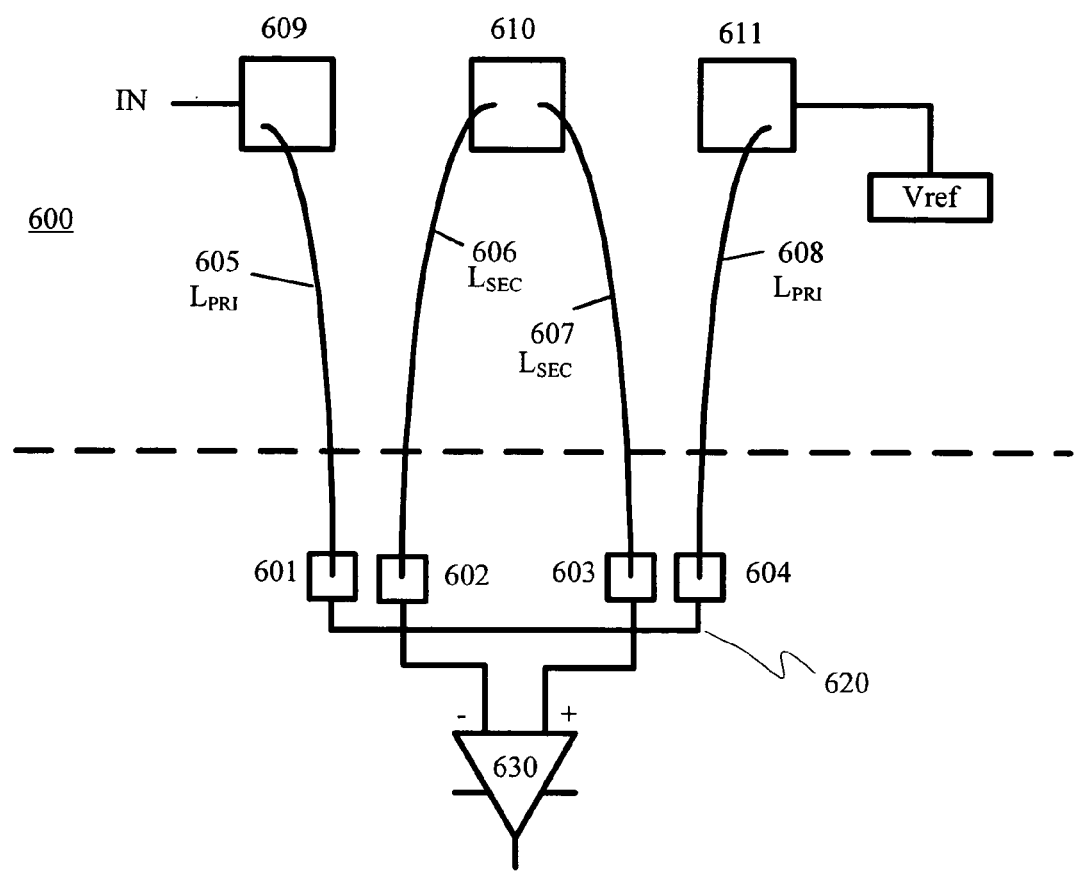
FIG. 6 illustrates an exemplary bonding diagram for a low noise amplifier input stage.

For example, FIG. 6 illustrates an exemplary bonding diagram 600 for an input stage of a low noise amplifier. In diagram 600, the negative input terminal of a low noise amplifier 630 (shown schematically) is connected to a bonding pad 602. In turn, bonding pad 602 is connected to a pin 610 via a connector 606. Similarly, the positive input terminal of low noise amplifier 630 is connected to a bonding pad 603. In turn, bonding pad 603 is connected to pin 610 via a connector 607. Bonding pads 601 and 604 can be connected to pins 609 and 611, respectively, via connectors 605 and 608. To provide the desired magnetic coupling, bonding pads 601 and 604 are connected using a connector 620.

In this configuration, pin 610 can be coupled to the second voltage source, pin 611 can be coupled to the reference voltage Vref, and pin 609 can be coupled to the input signal IN. Connectors 605 and 608 form the inductances $L_{in}$ (which may also be denoted $L_{PRI}$ to reflect the inductance of a transformer primary winding) whereas connectors 606 and 607 form the inductances $L_{RFC}$ (which may also be denoted $L_{SEC}$ to reflect the inductance of a transformer secondary winding). Advantageously, inductors $L_{in}$ and $L_{RFC}$ can also be implemented with bond wires placed in such proximity so as to create the desired mutual magnetic coupling M. Note that inductors $L_{in}$ can be connected (i.e. connector 620 can be implemented) on-chip using a metal interconnect or by using an intra-die bonding wire.

Accordingly, it is intended that the scope of the invention be defined by the following claims and their equivalents.

The invention claimed is:

1. A transformer for transforming a differential signal to a single-ended signal, the transformer comprising:
   a first pair of bonding wires, wherein a first bonding wire of the first pair is connected to the single-ended signal and a second bonding wire of the first pair is coupled to a reference voltage; and
   a second pair of bonding wires carrying a differential current associated with the differential signal, wherein a third bonding wire of the second pair is magnetically coupled to the first bonding wire, a fourth bonding wire of the second pair is magnetically coupled to the second bonding wire, the first and second bonding wires are electrically coupled, and each of the first, second, third, and fourth bonding wires is a single bonding wire partially disposed over silicon.

2. The transformer of claim 1, wherein the first and second bonding wires are electrically coupled using a fifth bonding wire.

3. The transformer of claim 1, wherein the first and second bonding wires are electrically coupled using interconnect on an integrated circuit.

4. The transformer of claim 1, wherein the reference voltage includes one of a virtual ground, ground, and VSS.

5. The transformer of claim 1, implemented in an output stage of an amplifier, the output stage including:
   a first transistor coupled between a first voltage source and the third bonding wire, the first transistor being controlled by a negative component of an input differential signal; and
   a second transistor coupled between the first voltage source and the fourth bonding wire, the second transistor being controlled by a positive component of the input differential signal.

6. The transformer of claim 1, implemented in an input stage of an amplifier, the input stage including:
   a negative input terminal of the amplifier coupled to the third bonding wire; and
   a positive input terminal of the amplifier coupled to the fourth bonding wire.

7. An amplifier output stage for transforming a differential signal to a single-ended signal, the amplifier output stage comprising:
   a first transistor controlled by a negative component of an input differential signal;
   a second transistor controlled by a positive component of the input differential signal;
   a first pair of bonding wires, wherein a first bonding wire of the first pair is coupled between a first voltage source and the first transistor, and wherein a second bonding wire of the first pair is coupled between the first voltage source and the second transistor; and
   a second pair of bonding wires, wherein a third bonding wire is coupled to the single-ended signal and a fourth bonding wire is coupled to a reference voltage, the third and fourth bonding wires are electrically coupled, the first and third bonding wires are magnetically coupled, the second and fourth bonding wires are magnetically coupled, and the first, second, third, and fourth bonding wires are individual bonding wires partially disposed over silicon.

8. The amplifier of claim 7, wherein the third and fourth bonding wires are electrically coupled using a fifth bonding wire.

9. The amplifier of claim 7, wherein the third and fourth bonding wires are electrically coupled using interconnect.

10. An amplifier input stage for transforming a single-ended signal to a differential signal, the amplifier input stage comprising:
    a first input terminal to the amplifier receiving a negative component of the differential signal;
    a second input terminal to the amplifier receiving a positive component of the differential signal;
    a first pair of bonding wires, wherein a first bonding wire of the first pair is coupled between a first voltage source and the first input terminal, a second bonding wire of the first pair is coupled between the first voltage source and the second input terminal, and the first and second bonding wires are individual bonding wires partially disposed over silicon; and
    a second pair of bonding wires, wherein a third bonding wire is coupled to the single-ended signal and a fourth bonding wire is coupled to a reference voltage, the third and fourth bonding wires are individual bonding wires partially disposed over silicon, the third and fourth bonding wires are electrically coupled, the first and third bonding wires are magnetically coupled, and the second and fourth bonding wires are magnetically coupled.

11. The amplifier of claim 10, wherein the third and fourth bonding wires are electrically coupled using a fifth bonding wire.

12. The amplifier of claim 10, wherein the third and fourth bonding wires are electrically coupled using interconnect.

13. A bonding configuration for an output stage of an amplifier, the output stage comprising:
    a first transistor controlled by a negative component of an input differential signal;
    a second transistor controlled by a positive component of the input differential signal;
    a first pair of bonding wires, wherein a first bonding wire of the first pair is coupled between a first voltage source and the first transistor, and wherein a second bonding wire of the first pair is coupled between the first voltage source and the second transistor; and
    a second pair of bonding wires, wherein a third bonding wire of the second pair is magnetically coupled to the first bonding wire, wherein a fourth bonding wire of the second pair is magnetically coupled to the second bonding wire, and wherein the third and fourth bonding wires are electrically connected;
    the bonding configuration including:
    a first bonding pad for coupling the first transistor and the first bonding wire;
    a second bonding pad for coupling the second transistor and the second bonding wire;
    a first pin for coupling the first and second bonding wires;
    a second pin for coupling the third bonding wire to an output of the output stage;
    a third pin for coupling the fourth bonding wire to a reference voltage;
    a third bonding pad for connecting to the third bonding wire;

a fourth bonding pad for connecting to the fourth bonding wire, wherein the third and fourth bonding pads are coupled using a connector.

14. A bonding configuration for an input stage of an amplifier, the input stage comprising:
    a first input terminal of the amplifier receiving a negative component of a differential signal;
    a second input terminal of the amplifier receiving a positive component of the differential signal;
    a first pair of bonding wires, wherein a first bonding wire of the first pair is coupled between a first voltage source and the first input terminal, and wherein a second bonding wire of the first pair is coupled between the first voltage source and the second input terminal; and
    a second pair of bonding wires, wherein a third bonding wire of the second pair is magnetically coupled to the first bonding wire, wherein a fourth bonding wire of the second pair is magnetically coupled to the second bonding wire, and wherein the third and fourth bonding wires are electrically connected;
    the bonding configuration including:
    a first bonding pad for coupling the first input terminal and the first bonding wire;
    a second bonding pad for coupling the second input terminal and the second bonding wire;
    a first pin for coupling the first and second bonding wires;
    a second pin for coupling the third bonding wire to an input of the input stage;
    a third pin for coupling the fourth bonding wire to a reference voltage;
    a third bonding pad for connecting to the third bonding wire;
    a fourth bonding pad for connecting to the fourth bonding wire, wherein the third and fourth bonding pads are coupled using a connector.

15. A method of combining power of a plurality of amplifiers to a single-ended power output, the method comprising:
    using bonding wire pairs to provide the single-ended power output, wherein each amplifier comprises an output stage including:
    a first transistor connected to a first voltage source and controlled by a negative component of an input differential signal;
    a second transistor connected to the first voltage source and controlled by a positive component of the input differential signal;
    a first pair of bonding wires electrically coupled to a second voltage source and to the first and second transistors; and
    a second pair of bonding wires magnetically coupled to the first pair of bonding wires,
    wherein the second pairs of bonding wires are electrically coupled in series between a first output providing the single-ended power output and a second output coupled to a reference voltage.

16. A bonding configuration for a plurality of amplifiers coupled to provide a single-ended power output, each amplifier comprising:
    an output stage including:
    a first transistor controlled by a negative component of an input differential signal;
    a second transistor controlled by a positive component of the input differential signal;
    a first pair of bonding wires electrically coupled to a first voltage source and to the first and second transistors; and
    a second pair of bonding wires magnetically coupled to the first pair of bonding wires,
    wherein the second pairs of bonding wires for the plurality of amplifiers are electrically coupled in series between the single-ended power output and a reference voltage;
    the bonding configuration for each output stage including:
    a first pair of bonding pads for coupling to first pair of bonding wires;
    a first pin for coupling the first pair of bonding wires to the first voltage source;
    a second pair of bonding pads for electrically coupling the second pair of bonding wires; and
    a pin pair for coupling to the second pair of bonding wires, wherein each pin of the pin pair is one of shared by an adjacent output stage, coupled to the single-ended power output, and coupled to the reference voltage.

* * * * *